(12) United States Patent
Suehira et al.

(10) Patent No.: US 7,708,927 B2
(45) Date of Patent: May 4, 2010

(54) IMPRINT METHOD AND IMPRINT APPARATUS

(75) Inventors: Nobuhito Suehira, Kawasaki (JP); Junichi Seki, Yokohama (JP); Shingo Okushima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/184,372

(22) Filed: Aug. 1, 2008

(65) Prior Publication Data
US 2009/0039550 A1   Feb. 12, 2009

(30) Foreign Application Priority Data
Aug. 9, 2007   (JP)   ............... 2007-208266

(51) Int. Cl.
*B29C 43/02*   (2006.01)
(52) U.S. Cl. .................................. 264/319
(58) Field of Classification Search ............ 264/294, 264/313, 319; 425/145, 150, 442
See application file for complete search history.

(56) References Cited

U.S. PATENT DOCUMENTS

| | | | | |
|---|---|---|---|---|
| 6,284,621 B1 * | 9/2001 | Chang et al. | ............... | 438/422 |
| 6,696,220 B2 | 2/2004 | Bailey et al. | ............. | 430/272.1 |
| 7,347,683 B2 | 3/2008 | Seki et al. | .................... | 425/182 |
| 2007/0026542 A1 * | 2/2007 | Sreenivasan et al. | .......... | 438/10 |
| 2008/0128945 A1 | 6/2008 | Seki et al. | ................... | 264/293 |
| 2008/0131550 A1 | 6/2008 | Seki et al. | ................... | 425/385 |

OTHER PUBLICATIONS

Stephen Y. Chou., et al., "Imprint of Sub-nm Vias and Trenches in Polymers," Applied Physics Letters, vol. 67, Issue 21, pp. 3114-3116 (1995).

* cited by examiner

*Primary Examiner*—Joseph S Del Sole
*Assistant Examiner*—James Sanders
(74) *Attorney, Agent, or Firm*—Fitzpatrick, Cella, Harper & Scinto

(57) ABSTRACT

An imprint method includes the steps of preparing a substrate, placing an uncured resin material on the substrate, preparing a mold having a first end and a second end, and placing the mold to oppose the substrate at a position not sandwiching the resin material. A first gap between the first end and the substrate and a second gap between the second end and the substrate are different from each other. Additional steps include imparting a relative movement between the substrate and the mold so that the resin material approaches the first end of the mold and enters through the first gap and fills at least a part of a space between the mold and the substrate, and changing at least one of the first and second gaps in the state that the resin material is present between the mold and the substrate.

14 Claims, 8 Drawing Sheets

(a)

(b)

IMPRINT METHOD AND IMPRINT APPARATUS

FIELD OF THE INVENTION AND RELATED ART

The present invention relates to an imprint method and apparatus for processing a member to be processed by transferring a shape of a mold onto the member to be processed.

In recent years, as described in Stephan Y. Chou et al., Appl. Phys., Lett., Vol. 67, Issue 21, pp. 3114-3116 (1995), a fine processing technology for transferring a fine structure on a mold onto a substrate such as a semiconductor, glass, a resin material, or a metal material has been developed and has received attention.

This technology is called nanoimprint or nanoembossing since it provides a resolution on the order of several nanometers.

The technology is expected to be applied to a wide variety of fields such as manufacturing technologies for optical devices such as photonic crystal and biochips such as μ-TAS (Micro Total Analysis System).

Of these nanoimprint technologies, the case of using a photoimprint method in a semiconductor manufacturing technology will be described.

First, on a substrate 8, e.g., a silicon substrate, a layer of a photocurable resin material is formed. Next, a mold on which a predetermined imprint (projection/recess) structure is formed is pressed against the resin material layer. The resin material layer is irradiated with ultraviolet (UV) light to be cured. As a result, the imprint structure is transferred onto the resin material layer. Etching or the like is performed through the resin material layer as a mask to transfer the imprint structure onto the substrate.

In such a semiconductor manufacturing technology high throughput is required. For example, in the case where the substrate is processed at a rate of 100 sheets/hour by a current photoexposure device, a time allocated to each sheet of the substrate is several tens of seconds.

Further, in the case where each sheet of the substrate has an area for 100 chips, each chip is required to be processed within one second.

In an imprint apparatus described in U.S. Pat. No. 6,696,220, a die-by-die method of aligning a mold and a substrate for each of the chips and a method of dispensing and applying a resin material with a dispenser are disclosed.

Current imprint apparatuses require several seconds to several tens of seconds per (one) chip, thus having throughput of several sheets per (one) hour.

In the imprint apparatus described in U.S. Pat. No. 6,696,220, as described above, the alignment between the mold and the substrate is effected by every chip in the die-by-die method and the method of dispensing and applying the resin material with the dispenser is employed. For that reason, the alignment and the resin material application require time therefore.

In order to reduce such time, it can be considered that alignment utilizing a global alignment method in which stage control is effected by using position measurement data for several chips or an application method such as spin coating is applied.

However, the nanoimprint further involves the following problems.

That is, it is necessary to effect imprint with a gap between the mold and the substrate of several tens of nanometers to several hundreds of nanometers, so that it takes time to effect alignment between the mold and the substrate with a predetermined gap.

Further, when imprint is performed onto a resin material applied to the substrate by using the aligned mold, it is necessary to await diffusion of the resin material in order to realize a predetermined thickness of the resin material. For this purpose, it takes time.

In these days, a low-viscosity resin material has been developed. An imprint method capable of reducing a filling time of the resin material by utilizing such a characteristic of the resin material is desired to be realized.

SUMMARY OF THE INVENTION

In view of the above-described problems, a principal object of the present invention is to provide an imprint method and an imprint apparatus which are capable of filling a resin material by reducing time to diffuse a resin material in order to provide a layer of the resin material with a predetermined thickness.

According to an aspect of the present invention, there is provided an imprint method, comprising the steps of:

preparing a substrate;

placing an uncured resin material on the substrate;

preparing a mold having a first end and a second end;

placing the mold to oppose the substrate at a position not sandwiching the resin material, wherein a first gap between the first end and the substrate and a second gap between the second end and the substrate are different from each other;

imparting a relative movement between the substrate and the mold so that the resin material approaches the first end of the mold and enters through the first gap and fills at least a part of a space between the mold and the substrate; and changing at least one of the first and second gaps in the state that the resin material is present between the mold and the substrate.

In the imprint method, in the step of changing at least one of the first and second gaps, the first gap may be equal to the second gap.

Further, it is preferable that the first end is a front end of the mold and the second end is a rear end of the mold, and the imprint method comprises a step of placing the mold to oppose the substrate so that the first gap is smaller than the second gap. In this case, the mold may be placed to form an angle of elevation as seen in a direction from the first gap to the second gap. Further, the substrate may be placed to form an angle of dip as seen in a direction from the first gap to the second gap.

In the above imprint method, when the mold has a normal vector of $\vec{n_1}$, the substrate has a normal vector of $\vec{n_2}$, and the mold has a normal vector of $\vec{n_3}$ in the case where a gap between the mold and the substrate is a predetermined value, the mold and the substrate are placed so that the normal vectors satisfy the following relationship:

$$(\vec{n_1} \times \vec{n_2}) \cdot \vec{n_3} = 0.$$

In the imprint method, when imprint is effected in each of a plurality of areas, rotational motion and translational motion may be repeated for each of the plurality of areas.

In the imprint method, that the first end is one side connecting a front end and a rear end of the mold and the second end is the other side connecting the front end and the rear end of the mold, and the imprint method comprises a step of placing the mold to oppose the substrate so that the first gap is smaller than the second gap.

In the imprint method, it is also preferable that the first end is a first point where a front end of the mold intersects with a side connecting the front end and rear end and the second end is a second point diagonal to the first point, and the imprint method comprises a step of placing the mold to oppose the substrate so that the first gap is the smallest gap and the second gap is the largest gap.

In the imprint method, when imprint is performed in a plurality of areas of the substrate, it is preferable that the first end is located in an area in which the imprint has already been performed and the second end is located in an area in which the uncured resin material is placed.

In the imprint method, the step of imparting the relative movement between the substrate and the mold may be performed while the uncured resin material is applied onto the substrate.

In the imprint method, when the uncured resin material is applied onto the substrate, an amount of application of the uncured resin material may be controlled depending on a change in space between the mold and the substrate due to a relative positional change between the mold and the substrate.

In the imprint method, the amount of application of the uncured resin material may be calculated on the basis of a length of the mold, an angle between the mold and a horizontal plane, an angle between the substrate and the horizontal plane, a minimum distance between the mold and the substrate, a speed of the mold, and an elapsed time.

In the imprint method, the step of imparting the relative movement and the step of changing at least one of the first and second gaps are performed simultaneously.

According to another aspect of the present invention, there is provided an imprint apparatus in which a mold having a processing surface on which a predetermined is formed is provided and an uncured resin material placed on a substrate is filled and cured in a space between the mold and the substrate and is subjected to imprint of the predetermined formed on the processing surface of the mold, the imprint apparatus comprising:

an attitude control mechanism for controlling attitudes of the mold and the substrate so that a first gap between a first end of the mold and the substrate and a second gap between a second end of the mold and the substrate are different from each other;

a measuring mechanism for measuring attitudes and positions of the mold and the substrate; and a mechanism for imparting a relative movement between the substrate and the mold so that the resin material approaches the first end of the mold and enters through the first gap and fills at least a part of the space between the mold and the substrate.

The imprint apparatus may further comprise an application mechanism capable of applying the resin material while moving the mold. The application mechanism may include means for calculating an amount of application of the resin material.

According to the present invention, it is possible to fill the resin material by reducing time to diffuse the resin material in order to provide the layer of the resin material with the predetermined thickness.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

An imprint method, in which an uncured resin material placed on a substrate is filled and cured between a mold and a substrate and a predetermined imprint formed on a processing surface of the mold is imprinted on the resin material, according to an embodiment of the present invention will be described.

In this embodiment, as an example of the imprint method of the present invention, such an imprint method that the resin material is filled between the mold and the substrate by changing in-plane positions of the mold and the substrate while the mold is kept in a non-parallel state with respect to the substrate will be described.

Figure 1:
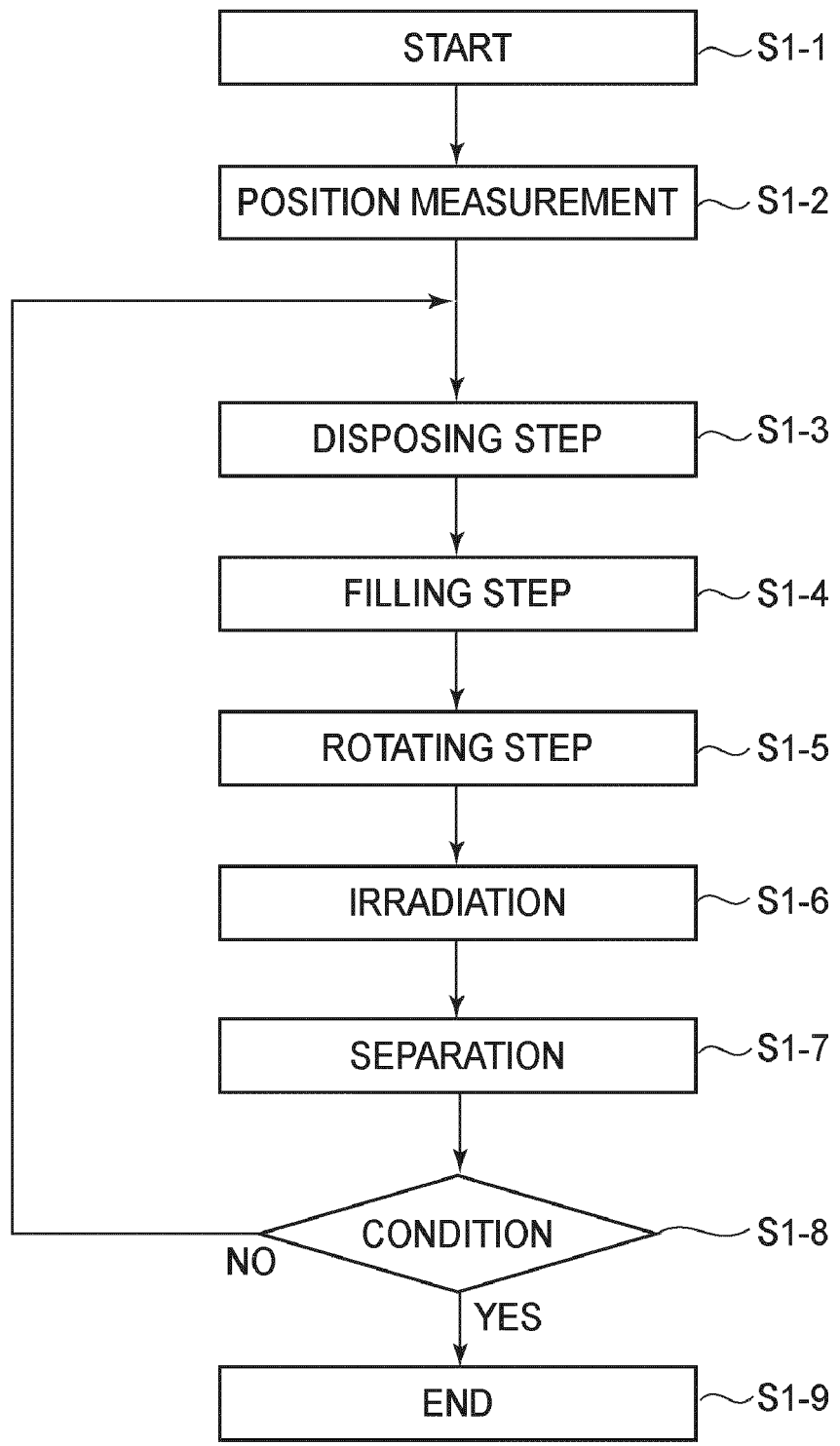
FIG. 1 is a flow chart for illustrating steps of an imprint method in an embodiment of the present invention.

FIG. 1 shows a flow chart for illustrating steps in the imprint method of this embodiment.

The imprint method of this embodiment is carried out in the following manner.

(1) As shown in FIG. 1, first, an imprint step is started to load the substrate on a substrate holding portion (S1-1). The mold is disposed in advance.

(2) Next, positional measurement of the substrate with respect to the mold is performed (S1-2). In the following respective steps, description will be made on the premise that a global alignment method in which imprint is carried out by utilizing accuracy of a stage on the basis of a result of the measurement in this step.

(3) In a first step of the imprint, first, stages for the mold and the substrate are moved to dispose the mold at a predetermined position relative to the substrate (S1-3). At this time, the mold is disposed so that a first gap between a first end of the mold and the substrate and a second gap between a second end of the mold and the substrate are different from each other. In this state, between the mold and the substrate, cured resin material and gas are present.

(4) Next, in a second step of the imprint, a relative movement between the mold and the substrate so that an uncured resin material (photocurable resin material) placed on the substrate approaches a front end of the mold and enters through a gap between the front end of the mold and the substrate. In this step, the mold and/or the substrate is moved. As a result, the mold and/or the substrate is changed in relative position and the resin material fills at least a part of a space between the mold and the substrate.

(5) Next, in a third step of the imprint, the mold and/or the substrate is rotated to change at least one of the first and second gaps. For example, the first and second gaps are made equal to each other (S1-5).

(6) In a subsequent step, the photocurable resin material is irradiated with ultraviolet (UV) light to be cured (S1-6).

(7) In a subsequent step, the mold is separated from the substrate by stage control of the mold and the substrate (S1-7).

(8) In a subsequent step, a judgment is made as to whether or not the imprint is completed in all the areas on the substrate (S1-8). In the case where the imprint is completed, the substrate is unloaded from the substrate holding portion so as to be moved to a position for a step such as a subsequent etching step (S1-9). In the case where the imprint is not completed, the procedure is returned to the step S1-3.

Next, a constitutional example in which the first end of the mold is a front end and the second end of the mold is a rear end as seen in a direction of movement of the mold will be described. However, the present invention is not limited thereto. For example, with respect to an axis perpendicular to the movement direction, the mold may also be disposed in an inclined state to increase a gap between the mold and the substrate where the uncured resin material is present, so that the uncured resin material easily enters through the gap to effect the imprint.

FIGS. 2(a) to 2(e) are schematic views for illustrating the above constitutional example.

In these figures, a reference numeral 201 represents a mold, a reference numeral 202 represents a cured resin material, a reference numeral 203 represents a substrate, a reference numeral 204 represents an uncured resin material, a reference numeral 205 represents a reference plane, a reference numeral 206 represents a target position of the mold 201, a reference numeral 207 represents an opposite position of the substrate 203, a reference numeral 208 represents a front end of the mold 201, and a reference numeral 209 represents a rear end of the mold 201.

In this constitutional example, the mold is moved relative to the substrate. Further, the global alignment method and the spin coating are employed.

Figure 2:
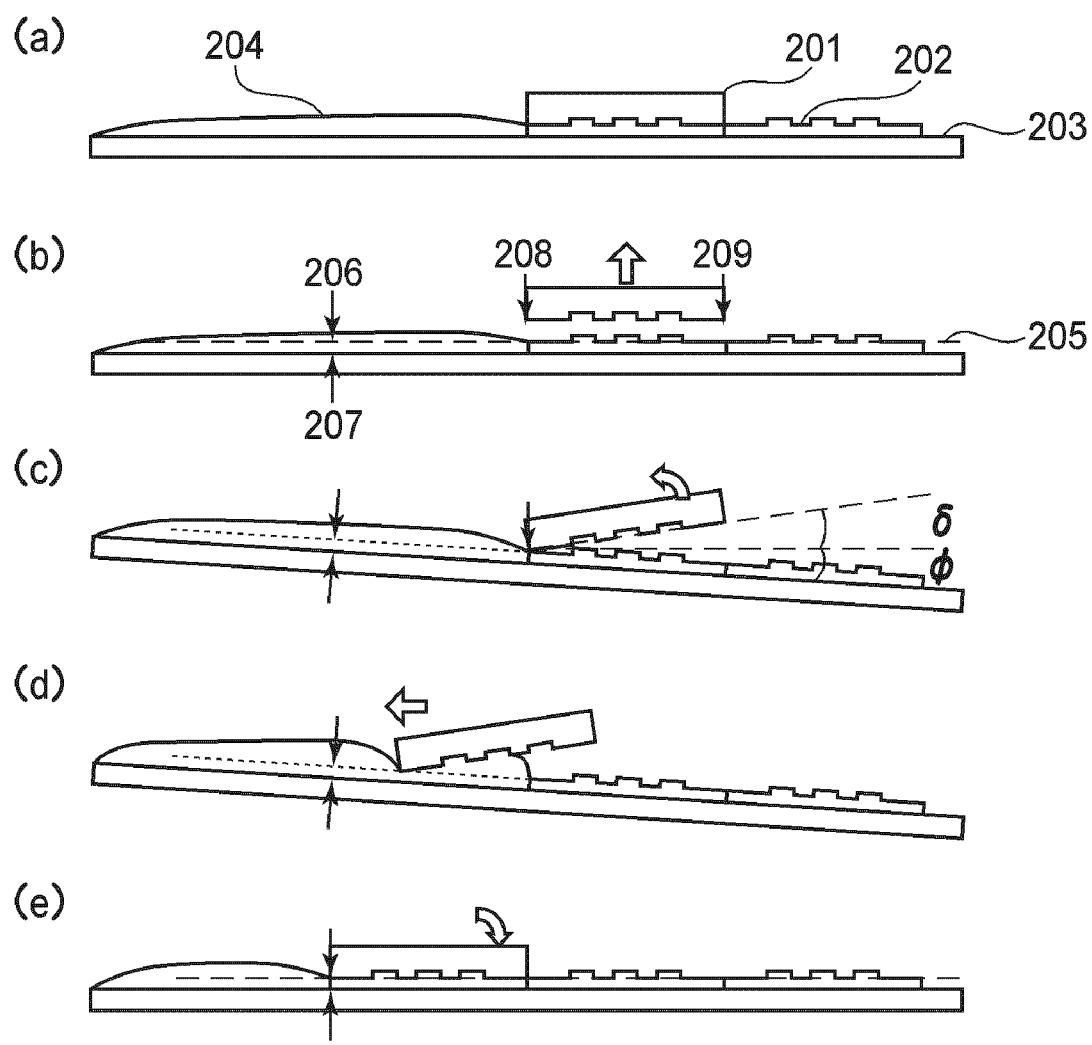
FIGS. 2(a) to 2(e) are schematic views for illustrating a constitutional example in the imprint method in which a first end is a front end of a mold and a second end is a rear end of the mold.

FIG. 2(a) shows a state of S1-6 in which a shape of the mold 201 is transferred onto the resin material on the substrate 203 and the resin material is cured. On the substrate 203, the cured resin material 202 and the uncured resin material 204 are present.

FIG. 2(b) shows a state of S1-7 after the mold 201 is moved apart and separated from the substrate 203 in a vertical direction. The reference plane 205 is at a level higher than a substrate surface by a thickness of a residual film layer. In this constitutional example, the reference plane 205 is horizontal plane. In the figure, a target imprint area is located on a left-hand side of the mold 201, so that the front end 208 is closer to the target imprint area than the rear end 209. In the case where the target imprint area is located on a right-hand side, the front end 208 and the rear end 209 are reversed.

It is preferable that there is no residual film but in this constitutional example, description is made on the premise that the residual film is controlled to have a predetermined thickness. The predetermined thickness is, e.g., several tens of nm to several μm.

Therefore, in view of this thickness, positions of stages for the mold and the substrate are determined. That is, the target position 206 of the mold 201 and the opposite position 207 of the substrate are determined.

FIG. 2(c) shows a state of S1-3 in which the mold 201 and the substrate 203 are disposed at predetermined positions. The mold 201 and the substrate 203 are disposed so that an angle (of elevation) δ is formed between the mold 201 and the reference plane 205 and an angle (of dip) φ is formed between the substrate 203 and the reference plane 205.

As a result, the arrangement of the mold and the substrate is such that the mold and the substrate are rotated at the position of the front end at the time of curing the resin material in a preceding step. It is desirable that the angle δ is within 0±5 degrees and the angle φ is within ±5 degrees.

In the case of using a 20 mm-square mold with the angle δ of 0.1 degree, a difference in height between the both ends is 34.9 μm. When the angle δ is 1 degree, the difference in height between the both ends is 349 μm. When the angle δ is 5 degrees, the height difference is 1750 μm.

The front end position, the opposite substrate position and the above angles are determined depending on an apparatus constitution, an aspect ratio of a pattern, a property of the resin material, and the like.

The reason why the separation step shown in FIG. 2(b) is performed is that breaking of the pattern is eliminated or alleviated by the vertical movement and separation of the mold from the substrate. Particularly, the separation step is effective in the case of the high aspect ratio of the pattern. An embodiment in which the separation step is not needed will be described in Embodiment 2.

FIG. 2(d) shows a step in which the mold is moved to the target position 206 while the first gap between the front end (first end) of the mold and the substrate is retained, and then the uncured resin material enters through the first gap and fills at least a part of a space between the mold and the substrate.

A matter of filling of the uncured resin material between the mold and the substrate is changed depending on a surface tension or capillary force which are affected by an angle (δ+φ) formed between the mold and the substrate, a characteristic of the uncured resin material, and surface treatment.

For example, there is the case where the resin material fills all of the space between the mold and the substrate and the case where a film is formed in a thickness determined by the first gap between the front end of the mold and the substrate.

The amount of the resin material required for the filling can be a total of a volume corresponding to the residual film between the mold and the substrate and a volume of the pattern.

FIG. 2(e) shows a state in which the front end of the mold reaches the target position and the mold and the substrate are rotated so as to provide a predetermined gap between the mold and the substrate.

By the rotation, the resin material is extruded from the space between the mold and the substrate. The extruded resin material may be protected from being cured by employing such an apparatus constitution that outside of the mold is not exposed to light or by increasing an interval between adjacent chips. The extruded resin material may also be removed by suction in the case of using a suction mechanism.

In the case where the die-by-die method for each of the chips is employed, alignment is performed in this step. Thereafter, the resin material is irradiated with UV light to transfer the pattern of the mold onto the resin material.

The process including the steps shown in FIG. 2(a) to 2(e) is repeated at necessary positions. The filling step shown in FIG. 2(d) and the rotation step shown in FIG. 2(e) may also be performed at the same time.

In the present invention, as the mold used, it is possible to use a mold for use in the photoimprint. The mold may preferably be formed of a transparent material such as $SiO_2$ including quartz, $CaF_2$, indium tin oxide (ITO), or sapphire glass.

The mold formed of such a material is basically usable so long as it has a thickness capable of providing projections and recesses on the order of nanometers. However, in the case of an excessively thin mold, there is a possibility that the pattern formed on the mold is not faithfully transferred due to elastic deformation or the like of the mold.

For this reason, in the present invention, the use of the mold having a thickness capable of suppressing the elastic deformation is effective. For that purpose, generally, the thickness may desirably be in the range of 1-100 mm, preferably 3-30 mm.

The above-described constitution achieves the following functional effects.

(1) By utilizing translational motion of the mold and the substrate, it is possible to forcedly fill the space between the mold and the substrate with the resin material. In some cases, this is controllable in a shorter time than the case of diffusion of the resin material.

(2) A more-than-necessary amount of the resin material does not readily enter the first gap between the front end of the mold and the substrate since the first gap is preliminarily controlled to be at a predetermined level.

(3) The first gap is smaller than the second gap, so that the pressure is liable to increase at the front end and is liable to decrease at the rear end. Therefore, the resin material is liable to diffuse backwardly.

(4) In the case where the angle φ is the angle of dip, the resin material is liable to flow into the space between the mold and the substrate by gravitation. The angle φ is determined depending on a characteristic of the resin material.

(5) The resin material can be pushed out to the outside of the space between the mold and the substrate by the rotations of the mold and the substrate.

Hereinbelow, the present invention will be described based on Embodiments.

Embodiment 1

Figure 3:
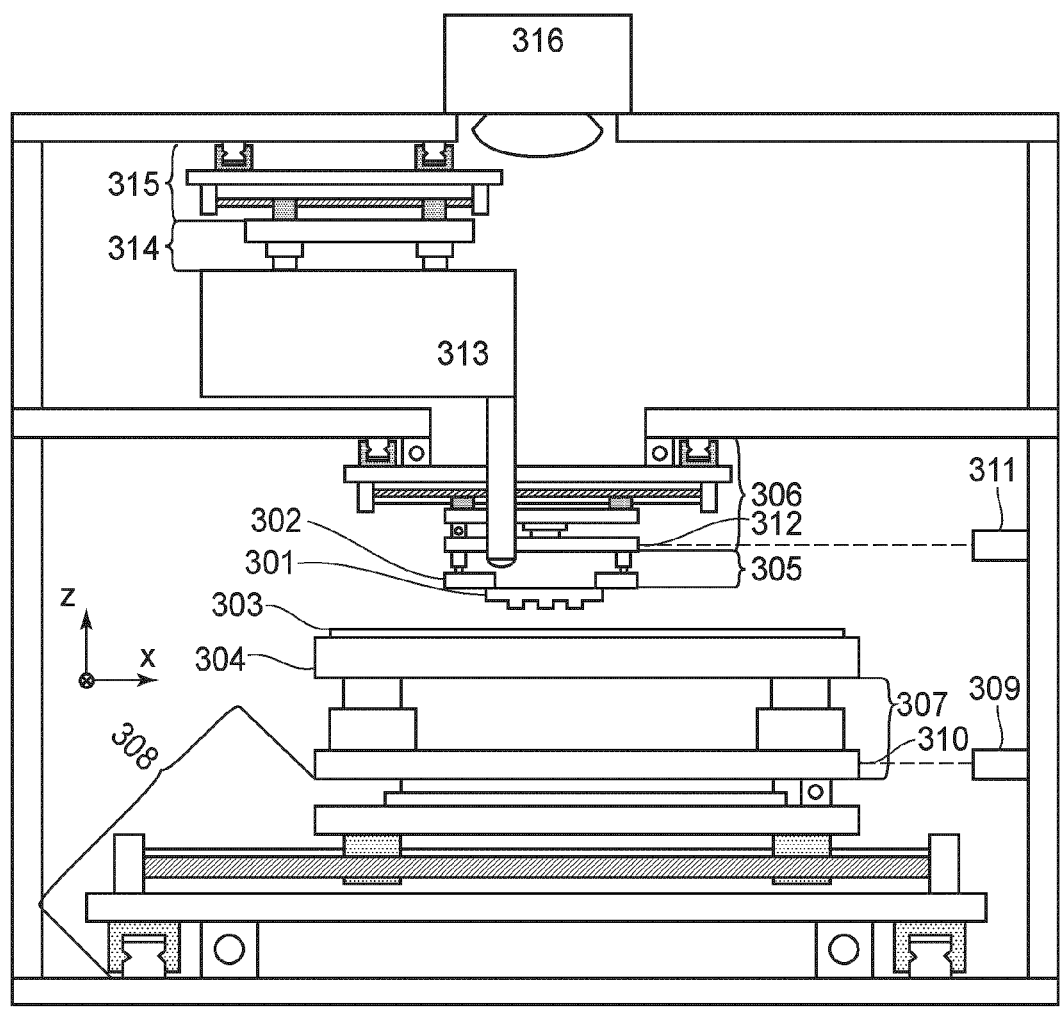
FIG. 3 is a schematic view for illustrating an imprint apparatus in Embodiment 1 of the present invention.

In this embodiment, a constitutional example of the imprint apparatus according to the present invention will be described. FIG. 3 illustrates the constitutional example of the imprint apparatus of this embodiment.

In FIG. 3, a reference numeral 301 represents a mold, a reference numeral 302 represents a mold holding mechanism, a reference numeral 303 represents a substrate, a reference numeral 304 represents a substrate holding mechanism, a reference numeral 305 represents a zαβ stage for the mold, a reference numeral 306 represents an xyθ stage for the mold, a reference numeral 307 represents a zαβ stage for the substrate, a reference numeral 308 represents an xyθ stage for the substrate, a reference numeral 309 represents an interferometer for the substrate, a reference numeral 310 represents a mirror for the substrate, a reference numeral 311 represents an interferometer for the mold, a reference numeral 312 represents a mirror for the mold, a reference numeral 313 represents an optical system, a reference numeral 314 represents a zαβ stage for the optical system, a reference numeral 315 represents an xyθ stage for the optical system, and a reference numeral 316 represents a light source.

In this embodiment, the mold 301 is held by the mold holding mechanism 302 by a vacuum chuck method or the like.

The mold 301 is moved by the xyθ stage 306 for the mold and can be attitude-controlled by the zαβ stage 305 for the mold constituting an attitude control mechanism.

In order to measure stage positions, the interferometer 311 for the mold and the mirror 312 for the mold which constitute a measuring mechanism are disposed.

The substrate 303 is disposed on the substrate holding mechanism 304. The substrate 303 can be positionally moved by the zαβ stage 307 for the substrate and can be attitude-controlled by the xyθ stage 308 for the substrate.

In order to measure stage positions, the interferometer 309 for the substrate and the mirror 310 for the substrate are disposed. The positions can be measured with respect to the respective axes.

The optical system 313 for measuring the position of the substrate relative to the mold can be moved by the xyθ stage 315 for the optical system and the zαβ stage 314 for the optical system. In the global alignment method, based on this measurement result, a driving profile of the stages for each of the chips is set. Control of the positional movement, pressurization, exposure, and the like with respect to the substrate is carried out by an imprint control mechanism (not shown).

The imprint apparatus includes the light source 316, a mechanism for applying the resin material (not shown), and a light blocking member (not shown) for preventing the resin material located out of the mold from being cured.

The attitude control of the mold will be described with reference to FIGS. 4(a) and 4(b).

Figure 4:
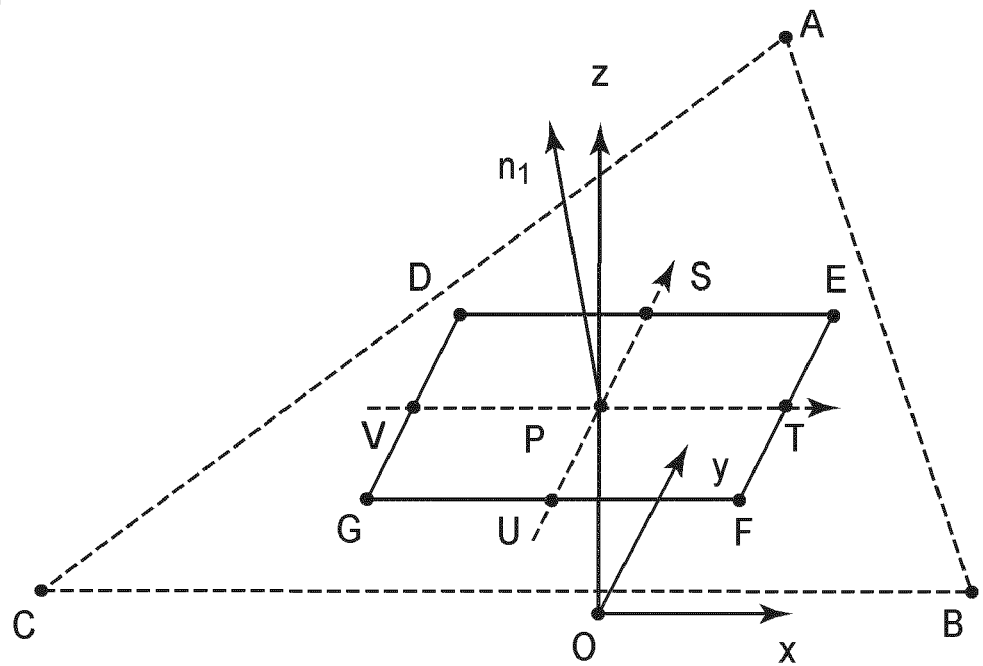
FIGS. 4(a) and 4(b) are schematic views for illustrating attitude control of a mold in Embodiment 1 of the present invention.
Figure 4:
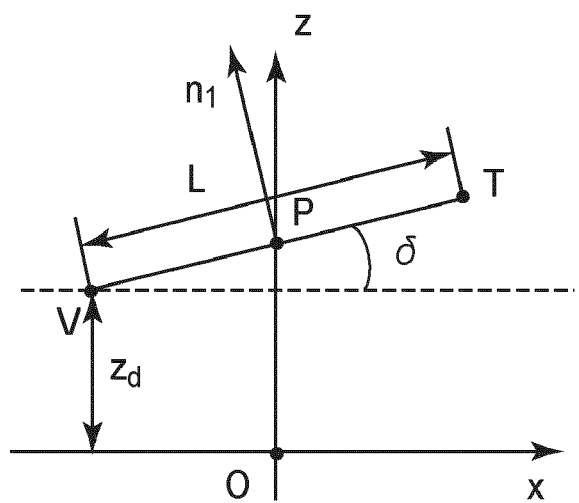

In FIG. 4(a), the zαβ stage for the mold is constituted by three z-direction moving mechanisms.

Three points defining a plane is A, B and C. The mold is represented by a rectangle DEFG. A length of a side of the mold is L. Each of the points A, B and C only has a variable z.

By the xyθ stage, it is possible to change values regarding x, y and θ at each point. The plane has a reference point P (0, 0, zp) moved in parallel to a z axis. For simplicity of explanation, the xyθ stage is described in a fixed state.

When sides DE, EF, FG and GD have midpoints S, T, U and V, respectively, the mold is constituted so as to be rotatable about a side PS and a side PT. Therefore, the point S is movable within a yz plane and the sides DE and PS are perpendicular to each other. Further, the point T is movable within an xz plane and the sides EF and PT are perpendicular to each other.

FIGS. 2(a) to 2(e) are sectional views taken along the xy plane in FIG. 4(a), wherein the front end 208 corresponds to the side DG and the rear end corresponds to the side EF.

Therefore, the mold is rotated about the side PS. As shown in FIG. 4(b), when a value $z_d$ of the point D and an angle δ formed between the side VT and the xy plane are determined, a position of the rectangle DEFG is determined, so that a mathematical expression for the plane can be calculated.

By substituting values of x and y for the points A, B and C into the mathematical expression, predetermined values of z for the respective points can be obtained.

A normal vector of the rectangle DEFG is represented by the following formula by using outer product.

$$\vec{n_1} = \frac{\overrightarrow{DE} \times \overrightarrow{DG}}{|\overrightarrow{DE}||\overrightarrow{DG}|} \quad (1)$$

When an arbitrary point in this plane is X, the following formula is satisfied.

$$\vec{n_1} \cdot \overrightarrow{DX} = 0 \quad (2)$$

Therefore, the predetermined z value can be obtained by substituting the x and y values of the points A, B and C into the mathematical expression.

Similarly, a normal vector of the substrate: $\vec{n_2}$ and z values of the respective axes can be obtained.

When a normal vector of the reference plane is $\vec{n_3}$, the three vectors are controlled to satisfy the following formula.

$$(\vec{n_1} \times \vec{n_2}) \cdot \vec{n_3} = 0 \quad (3)$$

As described above, in this embodiment, it is possible to employ a constitution in which the mold and the substrate are controlled so that the normal vector of the mold, when the first and second gaps between the mold and the substrate are equal to each other in the above-described step of changing at least one of the first and second gaps, is linearly dependent on the normal vector of the mold and the normal vector of the substrate.

In the case shown in FIGS. 2(a) to 2(e), the mold is rotated about the front end 208. In this case, it is possible to calculate the position of P by determining positions and angles of D and G.

Simultaneously with rotational motion, movement by the xyθ stage is carried out.

Embodiment 2

In this embodiment, a constitutional example of an imprint method capable of simultaneously performing the separation step and the arrangement step according to the present invention will be described.

FIGS. 5(a) to 5(d) are schematic views for illustrating the constitutional example of this embodiment.

In these figures, constituents identical to those in the embodiment shown in FIGS. 2(a) to 2(e) are represented by identical reference numerals or symbols, thus being omitted from redundant explanation.

Figure 5:
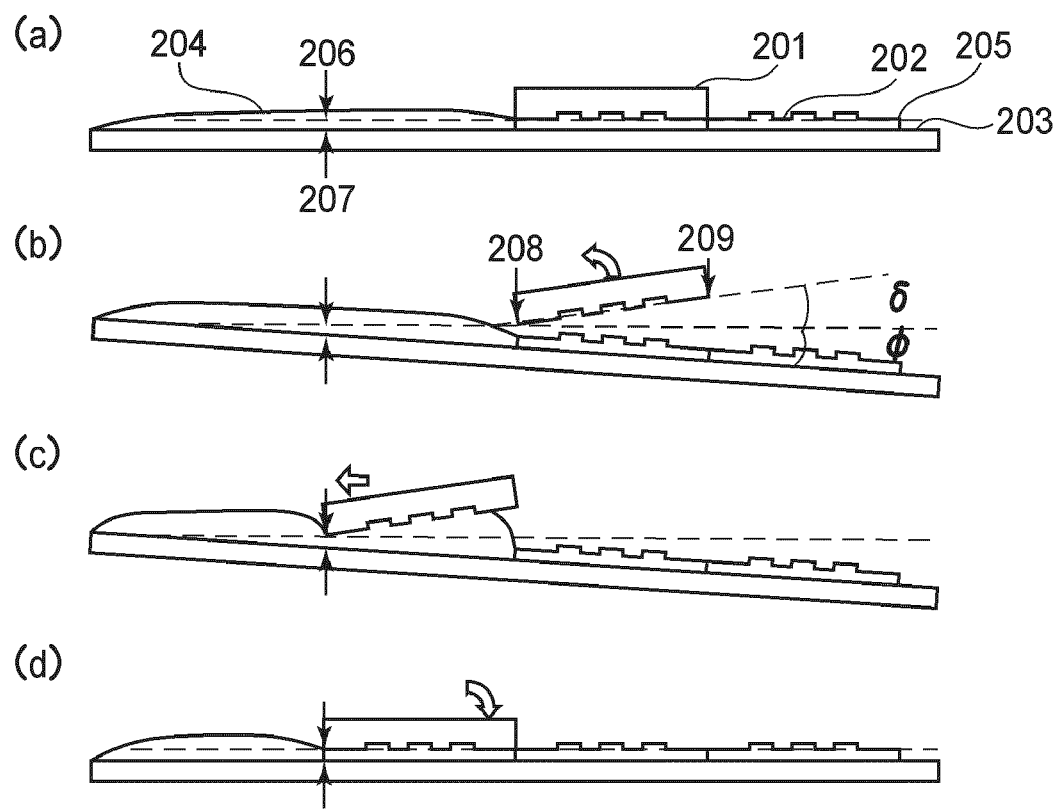
FIGS. 5(a) to 5(d) are schematic views for illustrating a constitutional example of an imprint method capable of performing a separating step and an arranging step simultaneously in Embodiment 2 of the present invention.

In the imprint method of this embodiment, FIG. 5(a) shows a state in which imprint in a preceding area is completed similarly as in FIG. 2(a).

FIG. 5(b) shows a state in which the mold and the substrate are separated and disposed at the same time.

The mold has the front end 208 as a rotation axis and the substrate has a substrate position 207, opposite to a target position 206 of the mold, as a rotation axis.

The front end 208 corresponds to the side DG in FIG. 4(a). The reason why the substrate is not rotated about the front end 208 is that there is a possibility that the substrate in the neighborhood of the front end 208 is not separated. Between the mold and the substrate, the cured resin material is present.

FIG. 5(c) shows a state in which the mold is moved along the reference plane to reach the target position 206. The reference plane is a horizontal plane.

In this case, the uncured resin material enters through the first gap and fills at least a part of a space between the mold and the substrate.

FIG. 5(d) shows a state in which after the mold reaches the target position, the mold and the substrate are rotated about the target position 206 and the opposite substrate position 207, respectively, to change the first and second gaps so as to be equal to each other.

Thereafter, the photocurable resin material is irradiated with the UV light to be cured.

In the case where the imprint in all the imprint areas is completed, the stage is moved to separate the mold from the substrate and the substrate is unloaded. In the case where the imprint is not completed, the procedure is returned to the step shown in FIG. 1.

According to the constitution of this embodiment, in the imprint in a plurality of areas on the substrate, when the imprint is carried out by repeating the rotational motion and the translational motion for each of the imprint areas, the separation step and the arrangement step are performed simultaneously in addition to the features of Embodiment 1. Therefore, it is possible to reduce the imprint time.

In the case where the mold and the substrate are moved vertically during the separation, a large separating force is required. On the other hand, the separation by the rotation also achieves an effect of reducing the separating force.

Embodiment 3

In this embodiment, a constitutional example of an imprint method according to the present invention in which the mold is disposed in an inclined state with respect to an axis perpendicular to the movement direction of the mold to particularly increase a gap between the mold and the substrate close to the uncured resin material, thus facilitating the flow of the uncured resin material will be described.

In this embodiment, a constitution in which the first end described with reference to FIG. 1 is one side connecting the front end of the mold and the rear end of the mold and the second end is the other side connecting the front end of the mold and the rear end of the mold and in which the first gap between the first end of the mold and the substrate is smaller than the second gap between the second end of the mold and the substrate.

Figure 6:
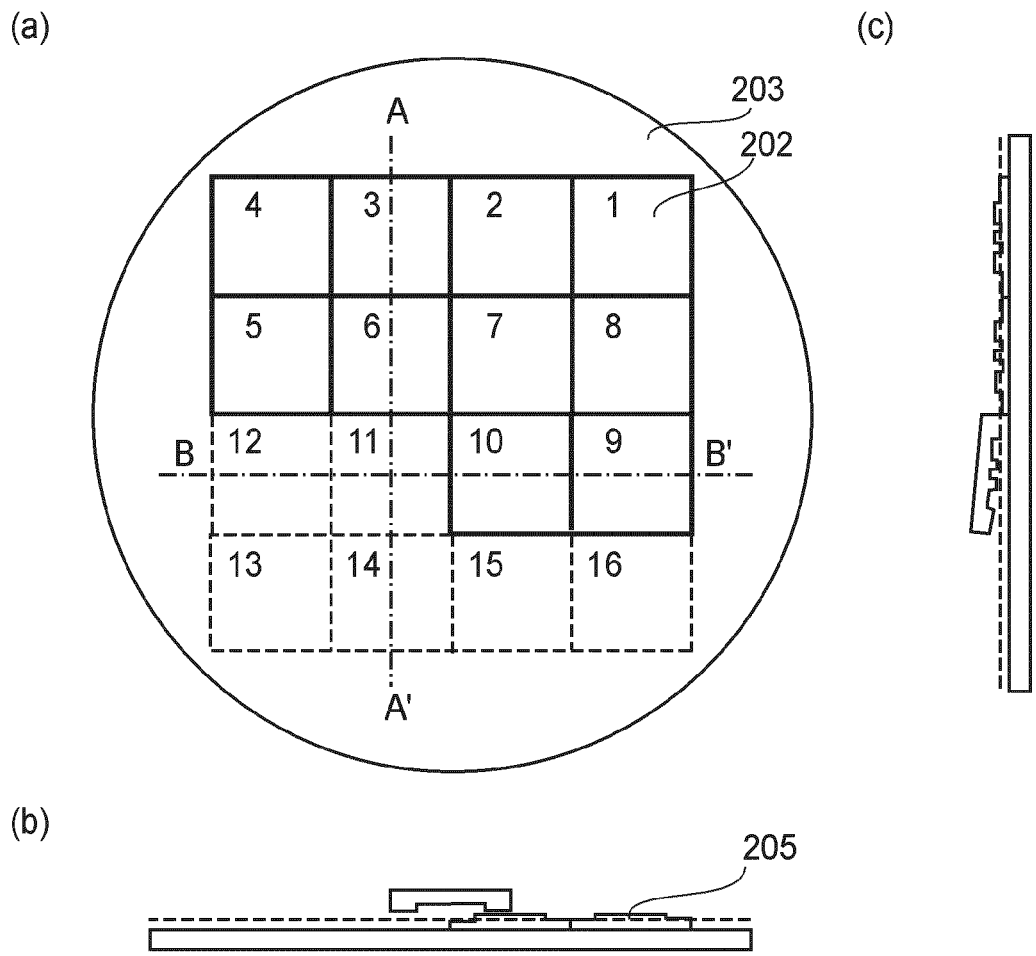
FIGS. 6(a) to 6(c) are schematic views for illustrating an example of a positional relationship between a mold and a substrate when imprint is performed in a plurality of areas of a substrate in Embodiment 3 of the present invention.

FIGS. 6(a) to 6(c) are schematic views for illustrating an example of a positional relationship between the mold and the substrate when the imprint is carried out in a plurality of imprint areas in this embodiment. For the sake of explanation, Nos. 1 to 16 are allocated to the plurality of imprint areas in FIG. 6(a).

In the imprint method of this embodiment, FIG. 6(a) shows a state in which the imprint in the imprint areas Nos. 1 to 10 is completed and the mold is moving from the imprint area No. 10 to the imprint area No. 11 and is in a state in which the front end of the mold reaches AA' line.

The imprint areas Nos. 11 to 16 are areas in which the uncured resin material is not cured.

In this state, AA' and BB' cross-section profiles are shown in FIGS. 6(c) and 6(b), respectively, in which information about a rearward direction is omitted. A gap between the end of the mold and the substrate on the side of the imprint area No. 6 (cured) is smaller than a gap between the end of the mold and the substrate on the side of the imprint area No. 14 (uncured) on the basis of the movement direction.

In order to specifically describe the constitution of this embodiment, when compared with the constitution described with reference to FIGS. 4(a) and 4(b), the side DG shown in FIG. 4(a) corresponds to the front end and the above-described one side as the first end in this embodiment corresponds to the side DE shown in FIG. 4(a). Further, the side EF (FIG. 4(a)) corresponds to the rear end and the other side as the second end in this embodiment corresponds to the side GF (FIG. 4(a)).

In this embodiment, such a constitution that the resin material is liable to flow toward the uncured resin material side by decreasing the gap between the one side (the first end) and the substrate which have been subjected to the imprint compared with the gap between the other side (the second end) and the substrate is employed.

In this case, the mold may also be disposed to oppose the substrate so that the first end in this embodiment is a point where the above-described one side intersects with the front end and the second end is another point diagonal to the point and so that a gap between the first end and the substrate is the smallest gap and a gap between the second end and the substrate is the largest gap. That is, referring to FIG. 4(A), such a constitution that a gap between the mold and the substrate at the point D is minimum and a gap between the mold and the substrate at the point F is maximum, thereby to fill the space between the mold and the substrate with the resin material may also be employed.

Generally, in the area where the resin material is cured, the residual film and the pattern are present, so that the uncured resin material is less liable to flow.

According to the constitution in this embodiment, the gap between the mold and the substrate closer to the side of the uncured resin material is increased, so that the flow of the resin material toward the side of the uncured resin material is accelerated to reduce the filling time.

Embodiment 4

In this embodiment, a constitutional example of an imprint method in which the mold or the substrate is moved while the resin material is applied, i.e., the filling step and the applying step can be performed at the same time will be described.

FIGS. 7(a) to 7(d) are schematic views for illustrating the constitutional example of this embodiment.

In these figures, constituents identical to those in the embodiment described with reference to FIGS. 2(a) to 2(e) are represented by identical reference numerals or symbols, thus being omitted from redundant explanation.

In FIGS. 7(a) to 7(e), a reference numeral 701 represents an application mechanism.

Figure 7:
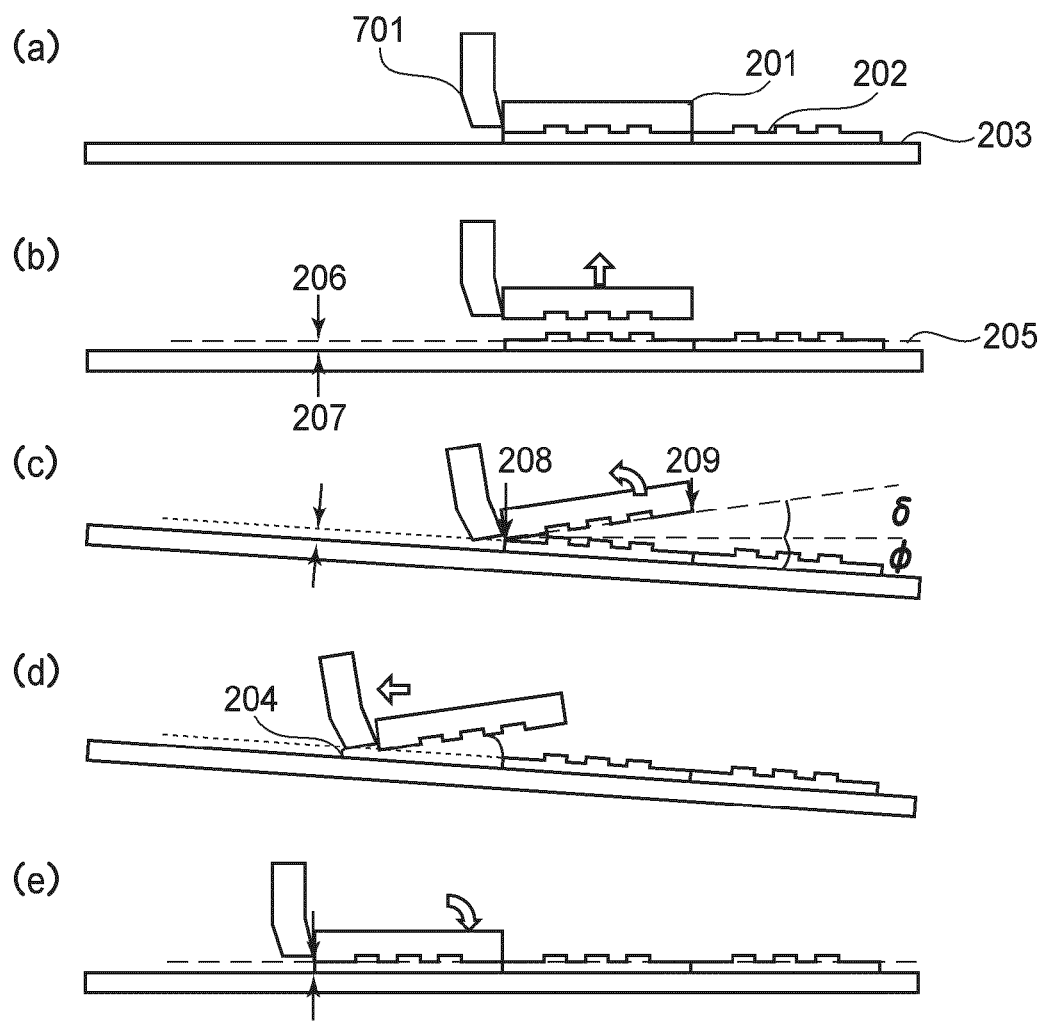
FIGS. 7(a) to 7(e) are schematic views for illustrating a constitutional example of an imprint method capable of moving a mold or a substrate while applying a resin material, i.e., performing a filling step and an applying step simultaneously in Embodiment 4 of the present invention.

In the imprint method of this embodiment, FIG. 7(a) shows a state in which the imprint in a preceding area is completed. An application device is disposed and the application mechanism 701 is movable in synchronism with movement of the mold 201.

FIG. 7(b) shows a state in which the mold and the substrate are separated from each other by the stages for the mold and the substrate.

FIG. 7(c) shows a state in which the mold and the substrate are disposed. In this case, an angle between the mold and the reference plane is δ and an angle between the substrate and the reference plane is φ. The cured resin material is present between the mold and the substrate.

FIG. 7(d) shows a state in which the application mechanism is moved while applying the resin material to fill a space between the mold and the substrate. In this step, an amount of application of the resin material is controlled depending on a change in space between the mold and the substrate caused by a relative positional change between the mold and the substrate. In the imprint method, a suction mechanism for removing the resin material through suction can be used.

FIG. 7(e) shows a state in which the front end of the mold reaches a target position and the mold and the substrate are rotated to create a predetermined gap between the mold and the substrate. The photocurable resin material is cured by UV light irradiation.

In the case where the imprint in all of predetermined imprint areas is completed, the stage is moved to separate the mold and the substrate. Then, the substrate is unloaded. In the case where the imprint is not completed, the procedure returns to the step of FIG. 7(a).

The application amount of the resin material will be described with reference to FIG. 8 by using a simplified model.

The resin material can be placed in a state in which it fills the entire space between the mold and the substrate and a state in which it extends with a predetermined interval.

In this embodiment, the case where the resin material fills the entire space between the mold and the substrate from the resin material application mechanism side with the relative positional change between the mold and the substrate will be described.

The gap between the end 208 of the mold and the substrate is taken as g. The mold is moved so that the resin material fills a trapezoid ABCD.

Figure 8:
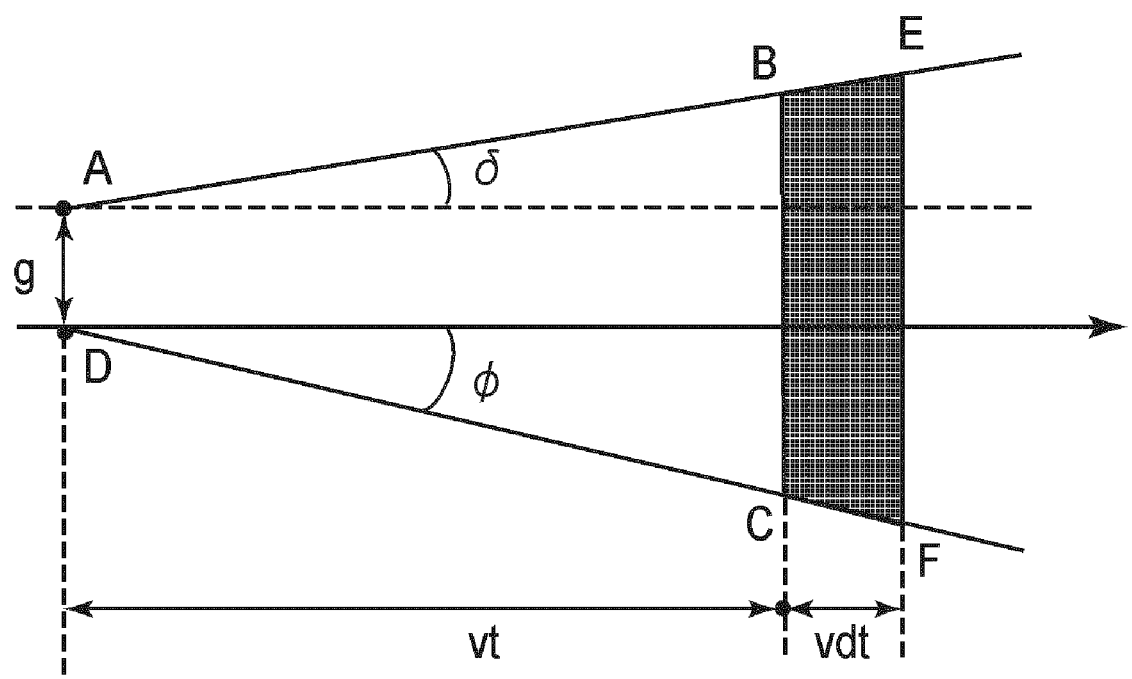
FIG. 8 is a schematic view for illustrating an amount of application of the resin material in Embodiment 4 of the present invention by employing a simplified model.

The point V in FIG. 4(a) corresponds to the point A in FIG. 8. An area change dS of the trapezoid ABCD occurs by movement of the mold from a position, after an elapsed time t at a speed v, by a distance vdt in a minute time dt.

$$dS = \frac{BC + EF}{2} vdt \tag{4}$$

From the formula (4), the following formula is derived.

$$\frac{dS}{dt} \approx \{vt(\tan\delta + \tan\phi) + g\}v \tag{5}$$

Therefore, a change in volume at a portion, between the mold and the substrate, not filled with the resin material is represented by the following formula (6).

$$\frac{dV}{dt} \approx L\{vt(\tan\delta + \tan\phi) + g\}v \tag{6}$$

The application amount of the resin material is calculated on the basis of this change in consideration of pattern shapes on the mold and the substrate and an amount of the resin material extruded out of the mold.

Specifically, the resin material application amount is calculated on the basis of a length of the mold, an angle between the mold and the horizontal plane, an angle between the substrate and the horizontal plane, a minimum distance between the mold and the substrate, a speed of the mold, and an elapsed time.

The application of the resin material may also be stopped when the application amount exceeds a certain amount by the gap between the mold and the substrate.

After the imprint is completed, the extruded resin material may be left standing as it is or removed through suction by the suction mechanism.

According to the constitution of this embodiment, in addition to the features of Embodiment 1, it is possible to perform the applying step and the filling step at the same time to reduce the imprint time.

Further, the application amount of the resin material is increased to forcedly flow the resin material into the gap between the mold and the substrate.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 208266/2007 filed Aug. 9, 2007, which is hereby incorporated by reference.

What is claimed is:

1. An imprint method, comprising the steps of:
preparing a substrate;
placing an uncured resin material on the substrate;
preparing a mold having a first end and a second end;
placing the mold to oppose the substrate at a position not sandwiching the resin material, wherein a first gap between the first end and the substrate and a second gap between the second end and the substrate are different from each other;
imparting a relative movement between the substrate and the mold so that the resin material approaches the first end of the mold and enters through the first gap and fills at least a part of a space between the mold and the substrate; and
changing at least one of the first and second gaps in the state that the resin material is present between the mold and the substrate.

2. A method according to claim 1, wherein in the step of changing at least one of the first and second gaps, the first gap is equal to the second gap.

3. A method according to claim 1, wherein the first end is a front end of the mold and the second end is a rear end of the mold, and
wherein said imprint method comprises a step of placing the mold to oppose the substrate so that the first gap is smaller than the second gap.

4. A method according to claim 3, wherein the mold is placed to form an angle of elevation as seen in a direction from the first gap to the second gap.

5. A method according to claim 3, wherein the substrate is placed to form an angle of dip as seen in a direction from the first gap to the second gap.

6. A method according to claim 1, wherein when the mold has a normal vector of $\vec{n_1}$, the substrate has a normal vector of $\vec{n_2}$, and the mold has a normal vector of $\vec{n_3}$ in the case where a gap between the mold and the substrate is a predetermined value, the mold and the substrate are placed so that the normal vectors satisfy the following relationship:

$$(\vec{n_1} \times \vec{n_2}) \cdot \vec{n_3} = 0.$$

7. A method according to claim 1, wherein when imprint is effected in each of a plurality of areas, rotational motion and translational motion are repeated for each of the plurality of areas.

8. A method according to claim 1, wherein the first end is one side connecting a front end and a rear end of the mold and the second end is the other side connecting the front end and the rear end of the mold, and
wherein said imprint method comprises a step of placing the mold to oppose the substrate so that the first gap is smaller than the second gap.

9. A method according to claim 1, wherein the first end is a first point where a front end of the mold intersects with a side connecting the front end and rear end and the second end is a second point diagonal to the first point, and
wherein said imprint method comprises a step of placing the mold to oppose the substrate so that the first gap is the smallest gap and the second gap is the largest gap.

10. A method according to claim 8, wherein when imprint is performed in a plurality of areas of the substrate, the first end is located in an area in which the imprint has already been performed and the second end is located in an area in which the uncured resin material is placed.

11. A method according to claim 1, wherein said step of imparting the relative movement between the substrate and the mold is performed while the uncured resin material is applied onto the substrate.

12. A method according to claim 11, wherein when the uncured resin material is applied onto the substrate, an amount of application of the uncured resin material is controlled depending on a change in space between the mold and the substrate due to a relative positional change between the mold and the substrate.

13. A method according to claim 12, wherein the amount of application of the uncured resin material is calculated on the basis of a length of the mold, an angle between the mold and a horizontal plane, an angle between the substrate and the horizontal plane, a minimum distance between the mold and the substrate, a speed of the mold, and an elapsed time.

14. A method according to claim 1, wherein said step of imparting the relative movement and said step of changing at least one of the first and second gaps are performed simultaneously.

* * * * *